(12) United States Patent
Ma et al.

(10) Patent No.: US 6,702,589 B1
(45) Date of Patent: Mar. 9, 2004

(54) LEADLESS SOCKET FOR DECAPPED SEMICONDUCTOR DEVICE

(75) Inventors: David SuitWai Ma, Cary, NC (US); Bing Ren, Cary, NC (US); James J. Dietz, Durham, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/222,693

(22) Filed: Aug. 16, 2002

(51) Int. Cl.$^7$ ................................................. H01R 9/09
(52) U.S. Cl. ......................................... 439/72; 439/912
(58) Field of Search ............................... 439/69, 70, 71, 439/72, 73; 257/912, 727

(56) References Cited

U.S. PATENT DOCUMENTS

| | | | | |
|---|---|---|---|---|
| 4,342,069 A | * | 7/1982 | Link ............................ | 361/764 |
| 5,180,976 A | * | 1/1993 | Van Loan et al. ........... | 324/754 |
| 5,801,929 A | * | 9/1998 | Cheng ......................... | 361/807 |
| 6,517,362 B2 | * | 2/2003 | Hirai et al. .................. | 439/82 |

* cited by examiner

Primary Examiner—Tulsidas Patel
Assistant Examiner—Phuong Dinh
(74) Attorney, Agent, or Firm—Brinks Hofer Gilson & Lione

(57) ABSTRACT

An apparatus for mounting a semiconductor device to a circuit board for testing is disclosed. The semiconductor device includes semiconductor circuitry and leads to connect the semiconductor circuitry to the circuit board. Additionally, the semiconductor device is decapped so that at least a portion of the semiconductor circuitry is exposed. The apparatus includes a frame and a fastener. The frame is adapted to mate with the semiconductor device, and forms an opening for accessing the semiconductor circuitry and an edge surface for receiving the semiconductor device. The fastener is connected with the frame for removably connecting the frame to the circuit board. By using a frame instead of a socket, the distance to the semiconductor device once the device is mounted to the circuit board, and particularly the top side of the semiconductor device, can be reduced so that the device may be tested using a probe.

20 Claims, 3 Drawing Sheets

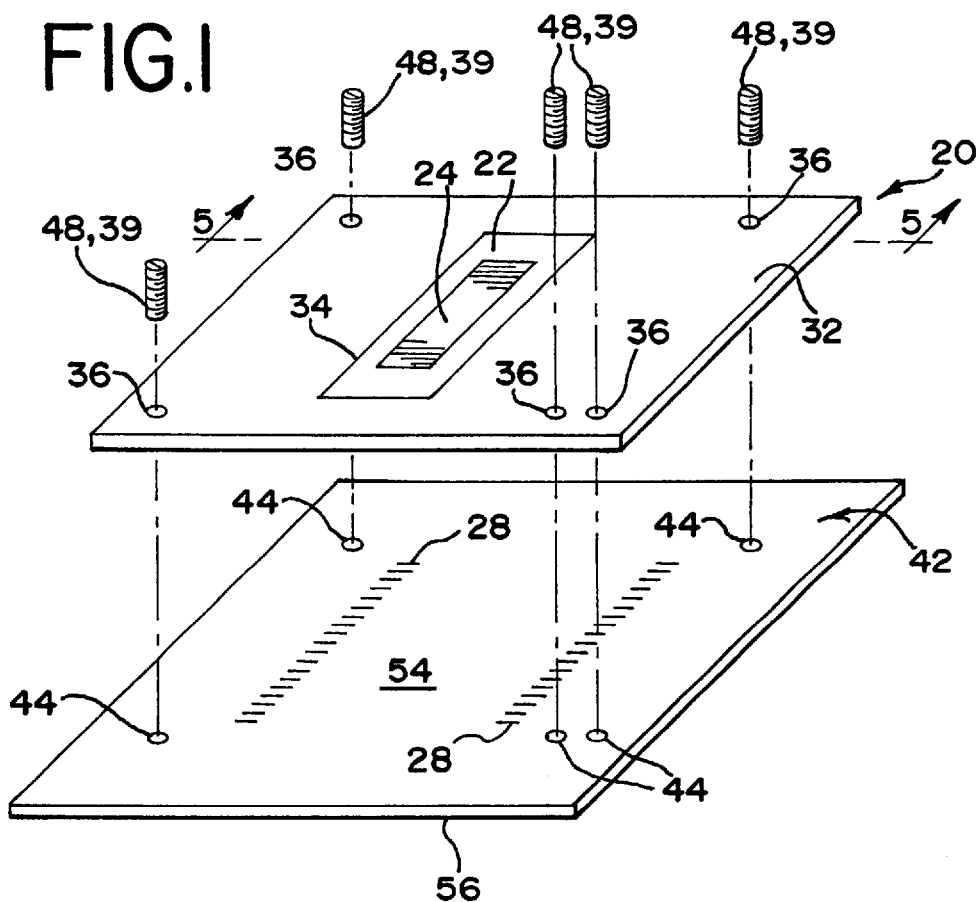
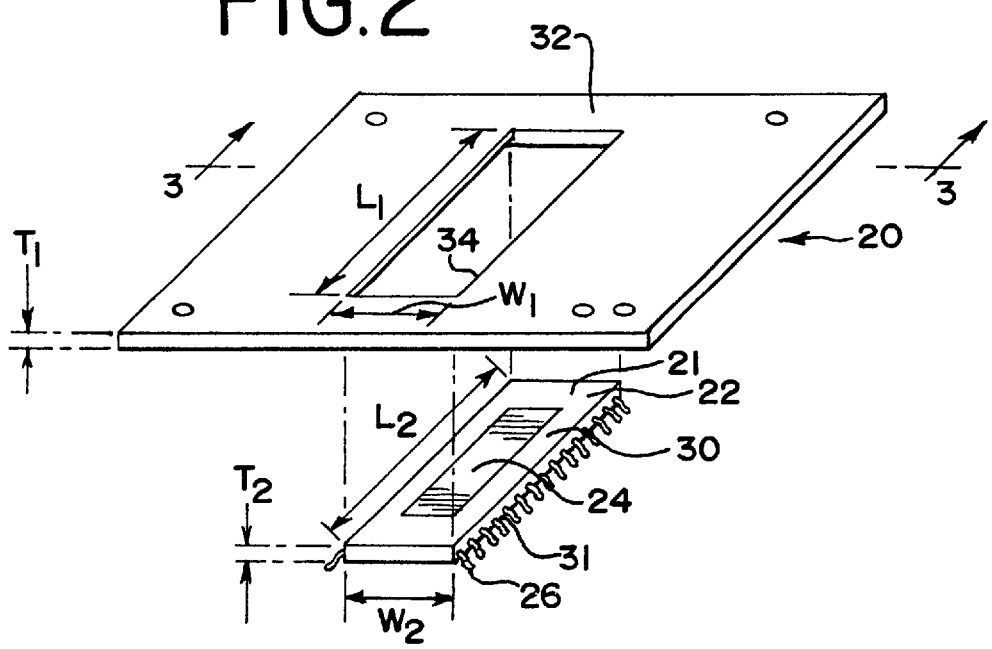

LEADLESS SOCKET FOR DECAPPED SEMICONDUCTOR DEVICE

BACKGROUND

Semiconductor devices are currently in widespread use in a variety of electronic components. Semiconductor devices may be used for a variety of reasons, such as to retain information, as in a non-volatile memory device, or to perform a calculation, such as in a microprocessor or in a digital signal processor. Semiconductor devices typically have a protective housing that houses semiconductor circuitry within the semiconductor device and leads connected with the semiconductor circuitry for connecting the semiconductor circuitry to a circuit board. Sometimes, a semiconductor device may fail due to a defect either in the manufacturing process or the design process. To determine why a particular semiconductor device has failed, the semiconductor device requires testing. In order to test the semiconductor device, the device needs to be decapped, that is, a portion of the top side of the protective housing needs to be removed in order to expose the semiconductor circuitry within.

Once decapped, the semiconductor device is then placed in a socket, such as the IC354 Socket manufactured by Yamaichi Electronics CO., LTD., of Tokyo, Japan. Once placed in the socket, the semiconductor device remains at a set distance from the top of the socket. The socket is attached to a low-noise printed circuit board which is connected to testing instruments. Once the printed circuit board is connected to the tester, a pico-probe, which is connected to the tester, may be used to probe and test the connections within the semiconductor circuitry. Since the length of the pico-probe is fixed, the distance from the top of the socket makes it more difficult for the pico-probe to connect with and probe the semiconductor circuitry once the semiconductor device is within the socket. Thus, there is a need for a device which can effectively be used to mount a semiconductor device to a circuit board for testing with a probe.

SUMMARY

The present invention is defined by the following claims, and nothing in this section should be taken as a limitation on those claims. By way of introduction, the preferred embodiments described below relate to a leadless socket for mounting a semiconductor device to a circuit board for testing. The semiconductor device includes semiconductor circuitry and leads to connect the semiconductor circuitry to the circuit board. Additionally, the semiconductor device is decapped so that at least a portion of the semiconductor circuitry is exposed. The leadless socket includes a frame and a fastener. The frame is adapted to mate with the semiconductor device, and forms an opening for accessing the semiconductor circuitry and an edge surface for receiving the semiconductor device. The fastener is connected with the frame for removably connecting the frame to the circuit board. By using a frame instead of a socket, the distance to the semiconductor device once the device is mounted to the circuit board, and particularly the top side of the semiconductor device, can be reduced so that the device may be tested using a probe, such as a pico-probe.

The preferred embodiments further relate to a method for mounting a semiconductor device to a circuit board for testing. The semiconductor device includes semiconductor circuitry and leads, and the semiconductor device is decapped so that at least a portion of the semiconductor circuitry is exposed along a top side of the semiconductor device. The circuit board includes traces along a top side of the circuit board.

The method includes forming a frame that mates with the semiconductor device. The frame has a top surface opposed to a bottom surface and an edge surface parallel to and recessed into the bottom surface. The frame forms an opening from the top surface to the edge surface for accessing the semiconductor circuitry. Additionally, the size of the opening is less than the size of the semiconductor device. The method further includes placing the top side of the semiconductor device in the frame against the edge surface so that the semiconductor circuitry is accessible through the opening. Moreover, the method includes fastening the frame and the semiconductor device to the circuit board, wherein the bottom surface faces the top side of the circuit board.

The preferred embodiments further relate to a leadless socket for mounting a semiconductor device to a circuit board for testing. The semiconductor device includes semiconductor circuitry and leads. The semiconductor device is decapped so that at least a portion of the semiconductor circuitry is exposed along a top side of the semiconductor device. Additionally, the circuit board includes traces along a top side of the circuit board. The leadless socket includes a frame that mates with the semiconductor device. The frame has a top surface opposed to a bottom surface and an edge surface parallel to and recessed into the bottom surface. The frame also forms an opening from the top surface to the edge surface for accessing the semiconductor circuitry. The size of the opening is less than the size of the semiconductor device. Further aspects and advantages of the invention are discussed below in conjunction with the preferred embodiments.

BRIEF DESCRIPTION OF THE DRAWINGS

FIG. 1 depicts a perspective view of a leadless socket mated with a semiconductor device for mounting the semiconductor device to a circuit board for testing, according to one embodiment of the present invention.

FIG. 2 depicts a perspective view of the leadless socket depicted in FIG. 1 along with the semiconductor device.

DETAILED DESCRIPTION OF THE PRESENTLY PREFERRED EMBODIMENTS

Referring to FIG. 1, there is shown a perspective view of a leadless socket 20 mated with a semiconductor device 22 for mounting the semiconductor device 22 to a circuit board 42 for testing, according to one preferred embodiment. The semiconductor device 22 may be a multitude of semiconductor devices, including but not limited to an integrated circuit (e.g., a semiconductor memory devices such as SRAM memory, DRAM memory, DDRAM memory, EPROM memory, EEPROM memory, and the like); a microprocessor; a programmable logic device; a data communications device; a clock generation device; and so forth. In one embodiment, the semiconductor device 22 comprises a DRAM memory chip.

Figure 3:
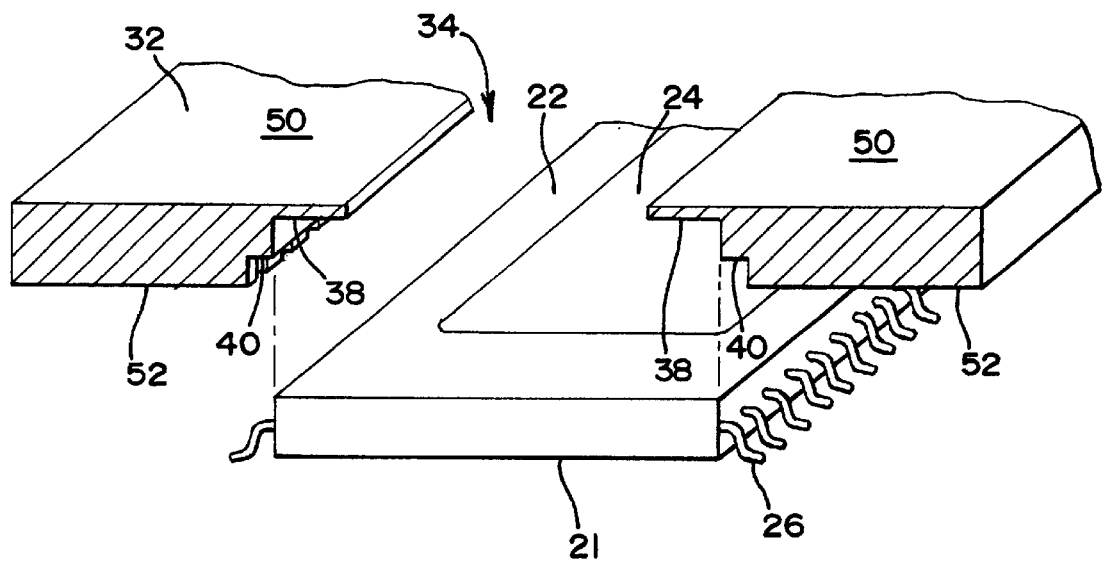
FIG. 3 depicts an enlarged cross-sectional view of the leadless socket and the semiconductor device depicted in FIG. 2.
Figure 4:
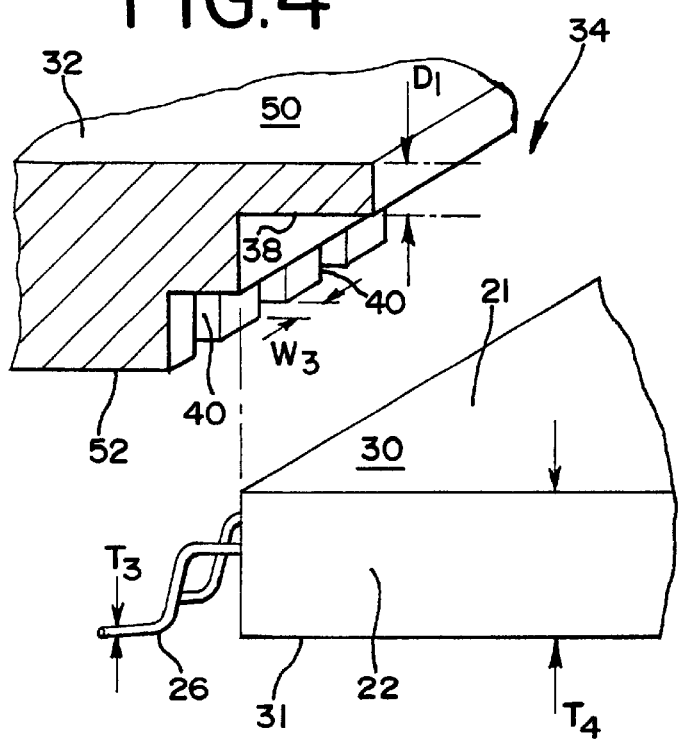
FIG. 4 depicts an enlarged partial cross-sectional side view of the leadless socket and the semiconductor device depicted in FIG. 3.

The exemplary semiconductor device 22 comprises semiconductor circuitry 24 and leads 26 to connect the semiconductor circuitry 24 to the circuit board 42, as illustrated in FIG. 2. The semiconductor device 22 also comprises a housing 21 which covers and protects the semiconductor circuitry 24. The housing 21 includes a top side 30 opposed to a bottom side 31. As defined herein, the semiconductor circuitry 24 is the actual circuitry that is fabricated within the semiconductor device 22. The semiconductor circuitry 24 is electrically connected to the leads 26. In order to test the semiconductor device 22, and particularly the semiconductor circuitry 24, in conjunction with the leadless socket 20 of this invention, the semiconductor device 22 is decapped so that at least a portion of the semiconductor circuitry 24 is exposed, as shown in FIGS. 1–3. The semiconductor device 22 is decapped using one of many methods known to those skilled in the art, such as, for example using precise machinery to cut or "gouge" away majority of the housing, then use corrosive liquid to etch away the remaining housing and exposing the die. The semiconductor circuitry 24 is exposed so that the semiconductor circuitry 24 may later be tested using a probe 46. Preferably the probe 46 is a pico-probe, such as the one manufactured by GGB Industries, Naples, Fla., USA. The probe 46 includes a tip 47 which is the only part of the probe which enters the opening 34 of the frame 32. The tip 47 of the probe 46 has a length $L_3$. When the semiconductor device 22 is decapped, a portion of the top side 30 is removed in order to expose the semiconductor circuitry 24 which lies beneath the top side 30. The semiconductor device 22 has dimensions defined by a length $L_2$, a width $W_2$, and a thickness $T_2$. In particular, the length $L_2$ and the width $W_2$ correspond to the dimensions of the top side 30 of the semiconductor device 22, while the thickness $T_2$ is the distance from the top side 30 to the bottom side 31, as illustrated in FIG. 4.

Figure 5:
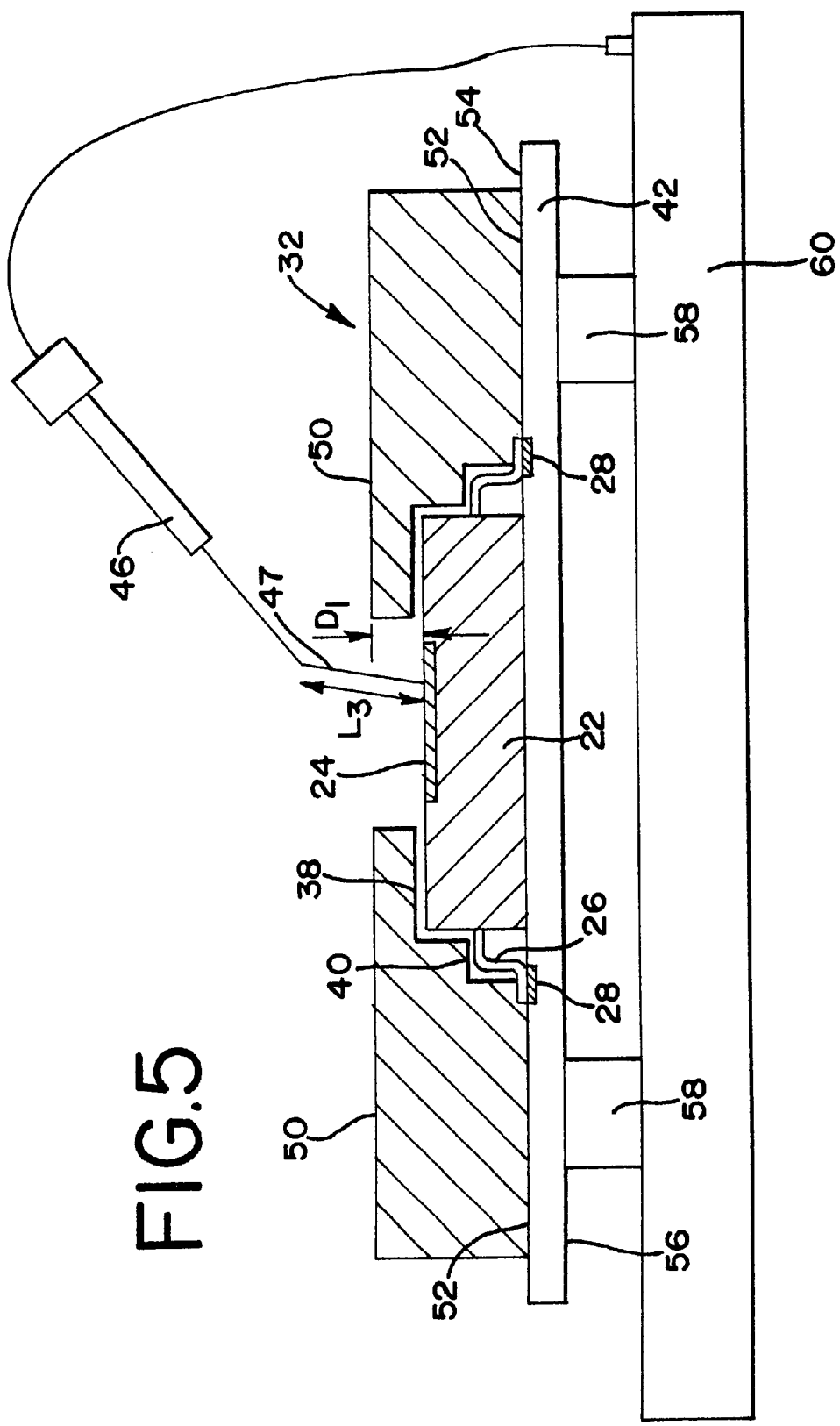
FIG. 5 depicts an enlarged cross-sectional view of the leadless socket mated with the semiconductor device and mounted to the circuit board depicted in FIG. 1.

The circuit board 42 is a specially designed circuit board which is to be connected with and used for testing the semiconductor circuitry 24 of the semiconductor device 22. Preferably, the circuit board 42 is a low-noise printed circuit board, however, other circuit board designs and other types of circuit board materials may be used to manufacture the circuit board 42. The circuit board 42 includes a top side 54 opposed to a bottom side 56, as illustrated in FIG. 5. The top side 54 includes a plurality of traces 28 which allow the circuit board 42 to be electrically connected with the leads 26 of the semiconductor device 22. The bottom side 56 includes at least one connector 58 for connecting the circuit board 42 to a testing apparatus 60 which is used to test the semiconductor device 22, as shown in FIG. 5. The circuit board 42 defines at least one circuit board hole 44. The circuit board hole 44 may receive a fastener 48 which may be used to attach the leadless socket 20 to the circuit board 42, as described below. In one embodiment, the circuit board 42 forms at least four, and preferably, five circuit boards holes 44 for receiving a plurality of fasteners 48 for mounting the leadless socket 20 to the circuit board 42.

Referring to FIG. 2, there is shown a perspective view of the leadless socket 20 depicted in FIG. 1 along with the semiconductor device 22, according to one embodiment. The leadless socket 20 includes a frame 32 adapted to mate with the semiconductor device 22 and a fastener 48 connected with the frame 32, as illustrated in FIG. 1. Preferably the frame 32 is manufactured from a non-conductive material, such as plastic, rubber, acrylic, and PCB blank or conductive material coated with a layer of nonconductive material. The frame 32 includes a top surface 50 opposed to a bottom surface 52 and an edge surface 38 recessed into the bottom surface 52, as illustrated in FIG. 3. The distance from the top surface 50 to the bottom surface 52 is defined herein as the thickness $T_1$ of the frame 32. Preferably, the thickness $T_1$ of the frame 32 is minimized in order to allow the probe 46 to connect with the semiconductor circuitry 24 on the semiconductor device 22. In one embodiment, the thickness $T_1$ of the frame 32 is less than twenty-five, and preferably twenty-two millimeters. In one embodiment the thickness $T_1$ of the frame 32 is no more than three times the thickness $T_2$ of the semiconductor device 22. In one embodiment the thickness $T_1$ of the frame 32 is no more than one and one-half times the thickness $T_2$ of the semiconductor device 22.

The edge surface 38 is recessed into the bottom surface 52. Preferably, the edge surface 38 is parallel to and recessed into the bottom surface 52. The edge surface 38 is designed to receive the semiconductor device 22 and also designed to serves to align the semiconductor device 22 with the frame 32, as illustrated in FIGS. 3–5. More particularly, the edge surface 38 is adapted to receive the top side 30 of the semiconductor device 22. The edge surface 38 may be formed in any one of a number of ways. For example, the edge surface 38 may be formed by machining the edge surface 38 into the bottom surface 52, the edge surface 38 may be formed using a mold, or the edge surface 38 may be formed by using a machine to stamp or press the edge surface 38 into the frame 32, and more particularly, into the bottom surface 52 of the frame 32. In one embodiment, the edge surface 38 is stamped or pressed into the bottom surface 52 of the frame 32. The edge surface 38 is a distance $D_1$ from the top surface 50, as illustrated in FIG. 4. The distance $D_1$ is less than the distance from the top surface 50 to the bottom surface 52. The distance $D_1$ is less than the length $L_3$ of the tip 47 of the probe 46 in order to allow the probe 46 to connect with and probe the semiconductor circuitry 24 on the semiconductor device 22. In one embodiment, the distance $D_1$ is less than ten millimeters. In another embodiment, the distance $D_1$ from the top surface 50 to the edge surface 38 is less than five millimeters. In one embodiment the distance $D_1$ from the top surface 50 to the edge surface 38 is less than three millimeters.

The frame 32 forms an opening 34 from the top surface 50 to the edge surface 38 for accessing the semiconductor circuitry 24. The opening 34 has dimensions which are defined by a length $L_1$ and a width $W_1$, as illustrated in FIG. 2. Preferably, the size of the opening 34 is less than the size of the semiconductor device 22. As defined herein, the size of the opening 34 is less than the size of the semiconductor device 22 when either the length $L_1$ of the opening 34 is less than the length $L_2$ of the semiconductor device 22 or the width $W_1$ of the opening 34 is less than the width $W_2$ of the semiconductor device 22 or both the length $L_1$ and the width $W_1$ less than the length $L_1$ and the width $W_2$ of the semiconductor device 22. The opening 34 is designed to allow a user to access the semiconductor circuitry 24 once the semiconductor device 22 has been mated with and received by the frame 32, as illustrated in FIGS. 1 and 5. In one embodiment, the width $W_1$ of the opening 34 is less than the width $W_2$ of the semiconductor device 22. In one embodiment, the length $L_1$ of the opening 34 is less than the length $L_2$ of the semiconductor device 22. By forming either the length $L_1$ or the width $W_1$ or both the length $L_1$ and the width $W_1$ of the opening 34 to be less than the length $L_2$ or the width $W_2$ or the length $L_2$ and the width $W_2$ of the semiconductor device 22, respectively, the frame 32, and particularly the opening 34 of the frame 32, prevents the semiconductor 22 from being pushed all the way through the opening 34 of the frame 32.

In one embodiment, the frame 32 forms a plurality of indentations 40 for receiving the leads 26, as illustrated in FIG. 4. The indentations 40 are adapted to mate with and receive the leads 26 so that once the semiconductor device 22 is inserted into and received by the frame 32, the leads 26 are also inserted into and received by the indentations 40. Preferably, the frame 32 is adapted to frictionally engage the semiconductor device 22. In one embodiment, the indentations 40 are adapted to frictionally engage the leads 26 of the semiconductor device 22. Preferably, the indentations 40 have a width $W_3$ that this is less than or equal to the thickness $T_3$ of the leads 26, allowing the indentations 40 to frictionally engage with the leads 26 of the semiconductor device 22, as illustrated in FIG. 4. In one embodiment, the indentions 40 have a thickness that is less then the thickness $W_3$ of the leads 26 allowing the leads to be slightly exposed from the plane of the bottom surface 52 to allow good electrical contact with the traces 28. The frame 32 may be a unitary or one-piece structure, as illustrated in FIG. 1, or the frame 32 may comprise multiple pieces (not shown).

The fastener 48 is connected with the frame 32 for removably connecting the frame 32 to the circuit board 42. Preferably, the fastener 48 is removably connected with the frame 32, as illustrated in FIG. 1. The fastener 48 can be any type of fastener which can be used to removably connect one object to a second object such as, but not limited to, a screw-type fastener such as a conventional screw, a piece of VELCRO™, a nut and bolt type fastener, a piece of double-sided tape, a clamp, a clip, a snap-fit connector, or a latching button. In one embodiment, the fastener 48 is a screw-type fastener 39 which fits through a frame hole 36 formed on the frame 32 and the existing circuit board hole 44 formed on the circuit board 42, as illustrated in FIG. 1. By using the existing circuit board hole 44, the screw-type fastener 39 can easily be used to removably connect the frame 32 to the circuit board 42.

The leadless socket 20 of the present invention operates in the following way. In order to mount a semiconductor device 22 to a circuit board 42 for testing using the leadless socket 20 of the present invention, the semiconductor device 22 must first be placed in the frame 32, and more particularly, the top side 30 of the semiconductor device 22 is placed in the frame 32 against the edge surface 38 so that the semiconductor circuitry 24 is accessible through the opening 34. Once the semiconductor device 22 is within the frame 32, the semiconductor device 22 and the frame 32 are then fastened to the circuit board 42, wherein the bottom surface 52 of the frame 32 faces and abuts against the top side 54 of the circuit board 42, as illustrated in FIG. 5. Preferably, the frame 32 and the semiconductor device 22 are attached to the circuit board 42 using at least one fastener 48. Once the frame 32 and the semiconductor device 22 are attached to the circuit board 42, a probe 46 is then placed through the opening 34 and in contact with the semiconductor circuitry 24, as illustrated in FIG. 5. After fastening the frame 32 and semiconductor device 22 to the circuit board 42, the circuit board 42 is then attached to a tester 60 for testing the semiconductor circuitry 24. The semiconductor circuitry 24 is tested by placing a probe 46 through the opening 34 and electrically connecting the probe 46 with the semiconductor circuitry 24. Since the edge surface 38 is a distance $D_1$ from the top surface 50, and since the distance $D_1$ is less than the length $L_3$ of the tip 47, the probe 46 is able to connect with and probe the semiconductor circuitry 24 on the semiconductor device 22. The probe 46 is also electrically connected with the tester 60 and used in conjunction with the tester 60 to test the semiconductor circuitry 24. The tester 60 that is used is any tester known by those skilled in the art such as the one manufactured by Credence/IMS, Beaverton, Oreg., USA. While in the above described embodiment, the probe 46 is electrically connected with the tester 60, the probe 46 may be connected with other testing equipment such as an oscilloscope, a function generator, a voltmeter, or a power supply.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

What is claimed is:

1. A leadless socket for mounting a decapped semiconductor device to a circuit board for testing, the semiconductor device comprising semiconductor circuitry and leads to connect the semiconductor circuitry to the circuit board, the socket comprising:
    a frame adapted to mate with the semiconductor device, the frame forming an opening for accessing the semiconductor circuitry and an edge surface for receiving the semiconductor device, wherein the frame is adapted to frictionally engage the semiconductor device; and
    a fastener connected with the frame for removably connecting the frame to the circuit board.

2. The leadless socket of claim 1, wherein the frame forms a plurality of indentations for receiving the leads.

3. The leadless socket of claim 1, wherein the fastener is one of a screw and a latching button.

4. The leadless socket of claim 1, wherein the frame comprises a nonconductive material.

5. The leadless socket of claim 1, wherein the width of the opening is less than the width of the semiconductor device.

6. The leadless socket of claim 1, wherein the length of the opening is less than the length of the semiconductor device.

7. The leadless socket of claim 1, wherein the thickness of the leadless socket is no more than three times the thickness of the semiconductor device.

8. The leadless socket of claim 1, wherein the frame comprises a top surface, wherein the top surface forms the opening, and wherein the distance from the top surface to the edge surface is less than five millimeters.

9. The leadless socket of claim 1, wherein the frame comprises a plurality of indentations for receiving the leads.

10. A method for mounting a semiconductor device to a circuit board for testing, the semiconductor device comprising semiconductor circuitry and leads, wherein the semiconductor device is decapped so that at least a portion of the semiconductor circuitry is exposed along a top side of the semiconductor device, and the circuit board comprising traces along a top side of the circuit board, the method comprising:
    forming a frame that mates with the semiconductor device so that the frame is adapted to frictionally engage the semiconductor device when the top side of the semiconductor device is placed in the frame, the frame having a top surface opposed to a bottom surface and an edge surface parallel to and recessed into the bottom surface, the frame forming an opening from the top surface to the edge surface for accessing the semiconductor circuitry, wherein the size of the opening is less than the size of the semiconductor device;
    placing the top side of the semiconductor device in the frame against the edge surface so that the semiconductor circuitry is accessible through the opening and the semiconductor device is frictionally engaged by the frame; and fastening the frame and the semiconductor device in its frictionally engaged condition to the circuit board, wherein the bottom surface faces the top side of the circuit board.

11. The method of claim 10, wherein the fastening of the frame further comprises connecting the leads with the traces.

12. The method of claim 10, further comprising:

placing a probe through the opening and in contact with the semiconductor circuitry; and testing the semiconductor circuitry.

13. The method of claim 10, further comprising removing the frame and the semiconductor device from the circuit board.

14. The method of claim 10, wherein the distance from the edge surface to the top surface of the frame is less than five millimeters.

15. The method of claim 10, wherein the width of the opening is less than the width of the semiconductor device.

16. A leadless socket for mounting a semiconductor device to a circuit board for testing, the semiconductor device comprising semiconductor circuitry and leads, wherein the semiconductor device is decapped so that at least a portion of the semiconductor circuitry is exposed along a top side of the semiconductor device, and the circuit board comprising traces along a top side of the circuit board, the leadless socket comprising:

a frame that mates with the semiconductor device so that the frame is adapted to frictionally engage the semiconductor device when the top side of the semiconductor device is placed in the frame, the frame having a top surface opposed to a bottom surface and an edge surface parallel to and recessed into the bottom surface, the frame forming an opening from the top surface to the edge surface for accessing the semiconductor circuitry, wherein the size of the opening is less than the size of the semiconductor device.

17. The leadless socket of claim 16, further comprising a fastener connected with the frame for removably connecting the frame to the circuit board.

18. The leadless socket of claim 16, wherein the frame forms a plurality of indentations for receiving the leads.

19. The leadless socket of claim 16, wherein the frame comprises a nonconductive material.

20. The leadless socket of claim 16, wherein the thickness of the frame is no more than one and one-half times the thickness of the semiconductor device.

* * * * *